(12) United States Patent
Xu et al.

(10) Patent No.: US 9,116,661 B2
(45) Date of Patent: Aug. 25, 2015

(54) STORAGE SERVE

(71) Applicants: INVENTEC (PUDONG) TECHNOLOGY CORPORATION, Shanghai (CN); INVENTEC CORPORATION, Taipei (TW)

(72) Inventors: Ji-Peng Xu, Shanghai (CN); Tsai-Kuei Cheng, Taipei (TW); Er-Zhen Song, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 291 days.

(21) Appl. No.: 13/846,706

(22) Filed: Mar. 18, 2013

(65) Prior Publication Data
US 2014/0085805 A1  Mar. 27, 2014

(30) Foreign Application Priority Data
Sep. 21, 2012 (CN) .......................... 2012 1 0355194

(51) Int. Cl.
| H05K 5/00 | (2006.01) |
| H05K 7/00 | (2006.01) |
| G06F 1/16 | (2006.01) |
| G06F 1/18 | (2006.01) |
| G06F 1/20 | (2006.01) |
| H05K 7/14 | (2006.01) |
| H05K 7/20 | (2006.01) |

(52) U.S. Cl.
CPC ........ *G06F 1/16* (2013.01); *G06F 1/183* (2013.01); *G06F 1/187* (2013.01); *G06F 1/188* (2013.01); *G06F 1/20* (2013.01); *H05K 7/1487* (2013.01); *H05K 7/20727* (2013.01)

(58) Field of Classification Search
CPC .............................. G11B 33/142; G06F 1/181
USPC ................ 361/679.46–679.51, 679.01–679.4
See application file for complete search history.

(56) References Cited

U.S. PATENT DOCUMENTS

| 2006/0041783 A1* | 2/2006 | Rabinovitz ........................ 714/6 |
| 2006/0048001 A1* | 3/2006 | Honda et al. ...................... 714/7 |
| 2011/0222227 A1* | 9/2011 | Xu et al. .................... 361/679.4 |

* cited by examiner

Primary Examiner — Jerry Wu
(74) Attorney, Agent, or Firm — Huffman Law Group, PC

(57) ABSTRACT

A storage server includes a cage, a midplane fixed on the cage, a fan module on midplane, at least one host, detachably disposed on the cage and electrically connected to the midplane, a plurality of HDD backplanes, detachably disposed on the cage and electrically connected to the midplane, and a plurality of data HDDs, detachably disposed on the cage and electrically connected to the HDD backplanes. The host can be detached from the cage along a first direction. The HDD backplanes can be detached from the cage along a second direction opposite to the first direction. The data HDDs and the host are respectively located at two opposite sides of the fan module, the data HDDs can be detached from the cage along a third direction intersected with the second direction and the first direction.

10 Claims, 4 Drawing Sheets

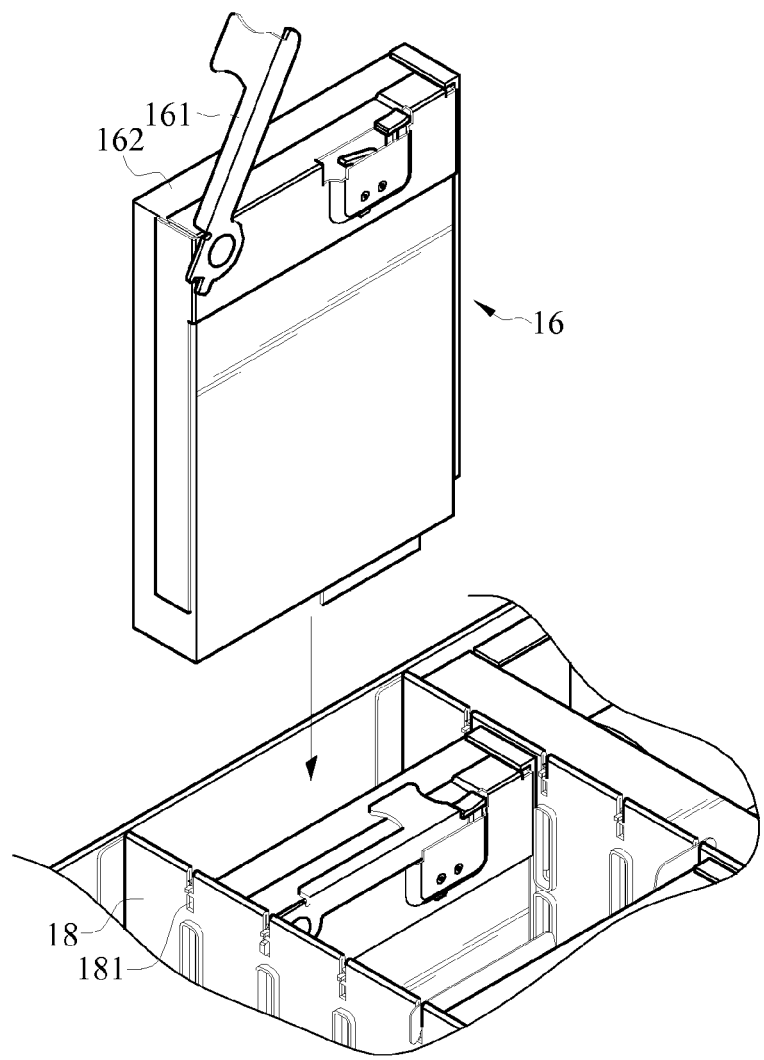
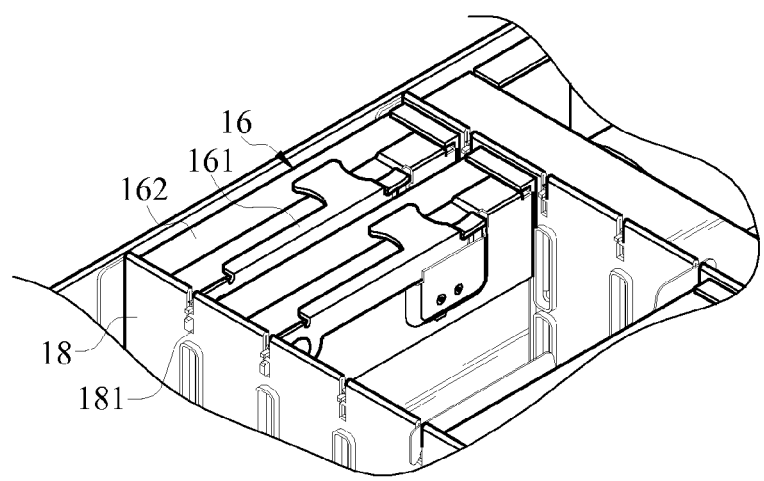
FIG.4
FIG.5

STORAGE SERVE

This non-provisional application claims priority under 35 U.S.C. §119(a) on Patent Application No(s). 201210355194.8 filed in China on Sep. 21, 2012, the entire contents of which are hereby incorporated by reference.

BACKGROUND OF THE INVENTION

1. Field of the Invention

The present disclosure relates to a storage server, and more particularly to a storage server in which internal electronic devices can be easily disassembled.

2. Description of the Related Art

Nowadays, information technology is rapidly developing, Enterprises and persons all use personal computers (such as a desktop computer and a notebook computer) to process affairs. However, along with the maturation of communication technology, conventional regional business mode has been replaced by transnational electronic business, so that enterprise electronization has become a trend. In this way, common personal computers cannot satisfy requirements of the enterprises on business. Therefore, computer manufacturers develop many servers each having a dedicated function (such as a cloud server and a firewall server) to solve the problems of the enterprises during electronization.

A common server comprises a cage and a plurality of electronic devices mounted in the cage, such as a power supply module, a motherboard, a data access hard disk, a hard disk drive (HDD) system, and a fan apparatus. Specifically, the cage needs to accommodate the electronic devices in limited accommodation space, and therefore, it can be imagined that the disposition of the electronic devices is complicated. Therefore, when a maintainer intends to repair or replace a certain electronic device inside the server, the maintainer always requires a large amount of time and effort to disassemble the server. In this way, the maintenance cost of the server is increased accordingly. Therefore, how to improve the spatial configuration of the electronic devices inside the server to improve the disassembly convenience of the server is an objective pursued by developers.

SUMMARY

A storage server disclosed in the present disclosure comprises a cage, a midplane, a fan module, at least one motherboard module, a plurality of HDD backplanes and a plurality of data HDDs. The midplane is fixed on the cage. The fan module is disposed on the cage, and is located on the midplane. The motherboard module is detachably disposed on the cage, and is electrically connected to the midplane. The motherboard module can be detached from the cage along a first direction leaving the midplane. The HDD backplanes are detachably disposed on the cage, and are electrically connected to the midplane. The HDD backplanes can be detached from the cage along a second direction leaving the midplane, and the second direction is opposite to the first direction. The data HDDs are divided into a plurality of groups, and are detachably disposed on the cage, where each group of the data HDDs is respectively electrically connected to one of the HDD backplanes. The data HDDs and the motherboard module are respectively located at two opposite sides of the fan module, the data HDDs can be detached from the cage along a third direction leaving the HDD backplanes, and the third direction is intersected with the second direction and the first direction.

In the storage server disclosed in the present disclosure, the third direction is orthogonal to the second direction and the first direction.

The storage server disclosed in the present disclosure further comprises a power supply module detachably disposed on the cage and electrically connected to the midplane, where the power supply module is located below the motherboard module, and the power supply module can be detached from the cage along the first direction.

In the storage server disclosed in the present disclosure, the motherboard module further comprises a motherboard, a system HDD, and a HDD control card. The system HDD is electrically connected to the motherboard, and the HDD control card is electrically connected to the data HDDs through the midplane, and controls operations of the data HDDs.

In the storage server disclosed in the present disclosure, the cage further comprises a bottom plate and two side plates located at two opposite sides of the bottom plate, the midplane and the HDD backplanes are disposed on the bottom plate, and the fan module, the motherboard module and the data HDDs are disposed between the two side plates.

In the storage server disclosed in the present disclosure, the bottom plate is further provided with two protruding stoppers, and one of the HDD backplanes is disposed between the two stoppers.

The storage server disclosed in the present disclosure further comprises a plurality of coupling boards, the HDD backplanes are fixed on the coupling boards, and the coupling boards and the HDD backplanes are detachably disposed on the cage together.

The storage server disclosed in the present disclosure further comprises a vertical plane erected on the midplane, the vertical plane being electrically connected to the midplane, the power supply module and the at least one motherboard module, and wherein the vertical plane is used for transmitting power of the power supply module to the motherboard module, and for transmitting the power to the data HDDs through the midplane, and wherein the data HDDs further transmit data with the motherboard module through the midplane and the vertical plane.

The storage server disclosed in the present disclosure further comprises a HDD frame disposed in the cage, where the data HDDs are disposed on the HDD frame.

In the storage server disclosed in the present disclosure, the HDD frame further has a fastening hole, the at least one data HDD further comprises a body and a fastening member pivoted to the body, the body of the at least one data HDD is disposed on the HDD frame, and the fastening member is buckled in the fastening hole.

BRIEF DESCRIPTION OF THE DRAWINGS

The present disclosure will become more fully understood from the detailed description given herein below for illustration only, and thus are not limitative of the present disclosure, and wherein:

FIG. 4 and FIG. 5 are schematic assembling views of a data HDD and a HDD frame according to FIG. 2.

DETAILED DESCRIPTION

Figure 1:
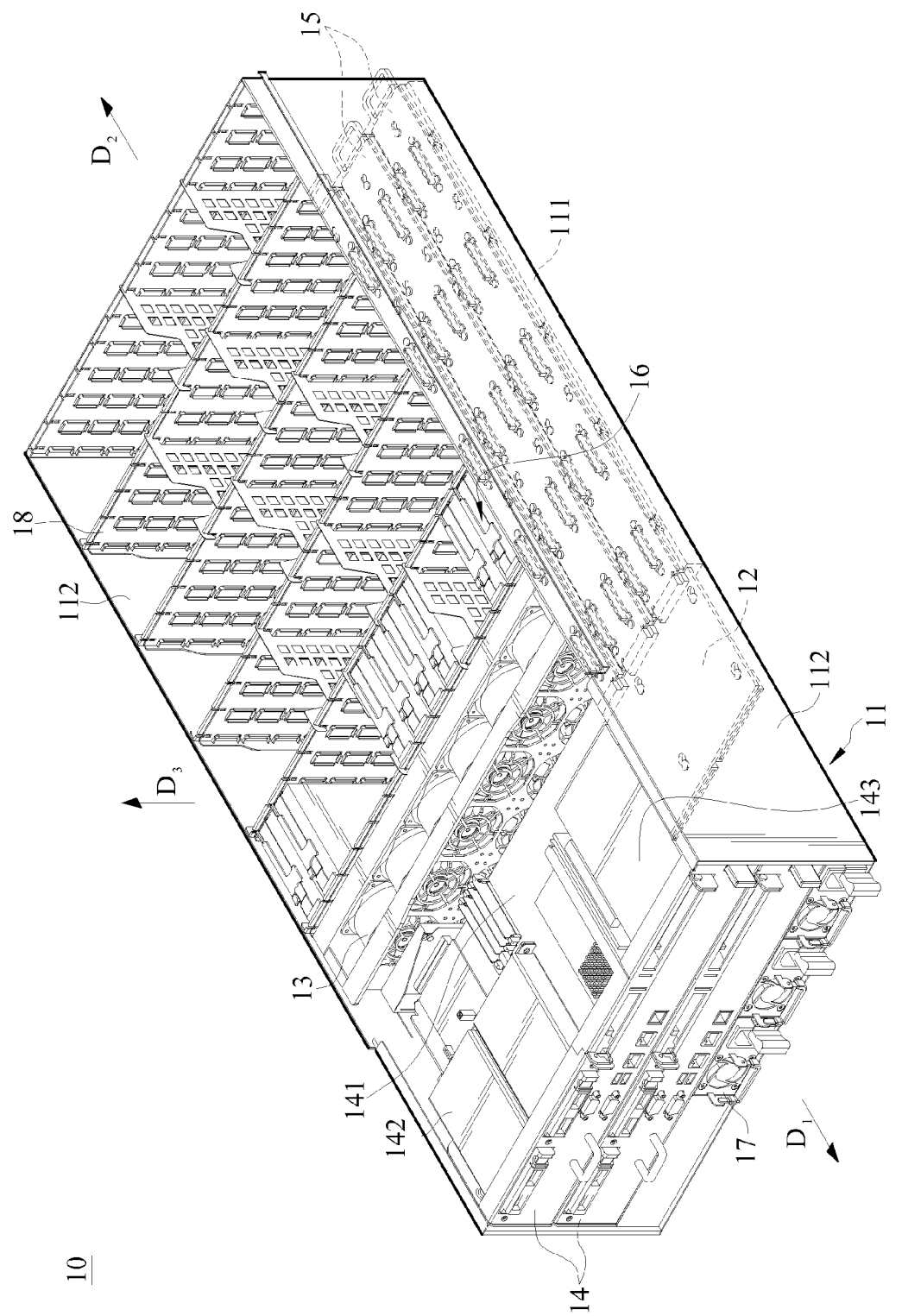
FIG. 1 is a storage server according to an embodiment of the present disclosure.
Figure 2:
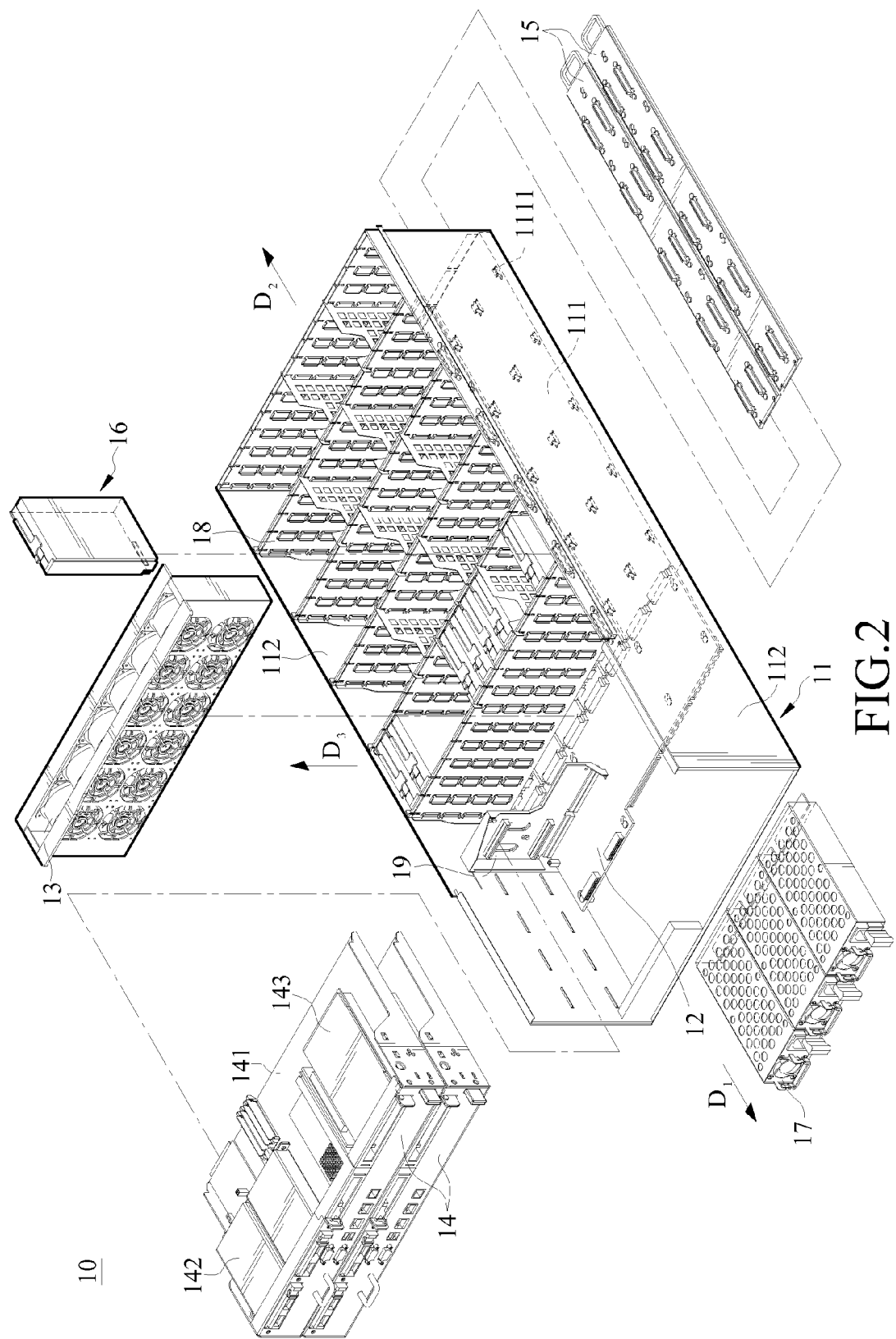
FIG. 2 is an exploded view of the storage server in FIG. 1.

Referring to FIG. 1 and FIG. 2, FIG. 1 is a storage server according to an embodiment of the present disclosure, and FIG. 2 is an exploded view of the storage server in FIG. 1.

A storage server 10 of this embodiment comprises a cage 11, a midplane 12, a fan module 13, at least one motherboard module 14, a plurality of HDD backplanes 15 and a plurality of data HDDs 16.

Further, the cage 11 further comprises a bottom plate 111 and two side plates 112 located at two opposite sides of the bottom plate 111. The midplane 12 is fixed on the bottom plate 111 of the cage 11. In this and some embodiments, the fan module 13 comprises a plurality of fans. The fan module 13 is disposed on the cage 11 and between the two side plates 112, and the fan module 13 is located on the midplane 12. The fan module 13 is used to dissipate the heat generated by the elements in the storage server 10.

Moreover, in this embodiment, the storage server 10 further comprises a vertical plane 19. The vertical plane 19 is erected on the midplane 12, and the vertical plane 19 is electrically connected to the midplane 12.

Moreover, the number of the motherboard modules 14 in this embodiment is two, and the two motherboard modules 14 are detachably disposed on the cage 11 and located between the two side plates 112. Each of the motherboard modules 14 is connected to the vertical plane 19, so that each of the motherboard modules 14 is electrically connected to the midplane 12. In addition, one of the motherboard modules 14 is superposed on the other motherboard module 14. Each motherboard module 14 further comprises a motherboard 141, a system HDD 142 and a HDD control card 143, and the system HDD 142 is electrically connected to the motherboard 141. Moreover, each motherboard module 14 can be detached from the cage 11 along a first direction D1 leaving the midplane 12 or leaving the vertical plane 19, so that each motherboard module 14 can be disassembled from the cage 11.

It should be noted that, in this embodiment, as an example, the number of the motherboard modules 14 is two, and one motherboard module 14 is superposed on the other motherboard module 14. However, the number of the motherboard modules 14 and the relative positions of the motherboard modules 14 are not intended to limit the present disclosure. For example, in another embodiment, the number of the motherboard module 14 may be one or greater than three. Also, in another embodiment, the plurality of motherboard modules 14 may be configured on the cage 11 side by side.

The HDD backplane 15 of this embodiment is a long circuit board, each HDD backplane 15 is detachably disposed on the bottom plate 111 of the cage 11, and each HDD backplane 15 is electrically connected to the midplane 12. Moreover, each HDD backplane 15 can be detached from the cage 11 along a second direction D2 leaving the midplane 12, so that each HDD backplane 15 is disassembled from the cage 11, and the second direction D2 is opposite to the first direction D1. It should be noted that, as an example, the number of the HDD backplanes 15 shown in this embodiment is two, but the present disclosure is not limited thereto. In another embodiment, the number of the HDD backplanes 15 may be greater than three.

In addition, in this embodiment, the storage server 10 further comprises a HDD frame 18, and the HDD frame 18 is disposed in the cage 11. Specifically, the HDD frame 18 is disposed on the bottom plate 111, and the HDD frame 18 is disposed between the two side plates 112.

The storage server 10 of this embodiment may comprise a plurality of data HDDs 16, and the data HDDs 16 are divided into a plurality of groups. The data HDDs 16 are detachably disposed on the cage 11 and located on the HDD frame 18, and the data HDDs 16 are disposed between the two side plates 112. Specifically, the HDD frame 18 is used to accommodate the plurality of data HDDs 16, so that the plurality of data HDDs 16 may be mounted to the cage 11 simultaneously through the HDD frame 18. When each group of the data HDDs 16 is located on the HDD frame 18, each group of the data HDDs 16 is respectively electrically connected to one of the HDD backplanes 15. Moreover, the HDD control card 143 of the motherboard module 14 is electrically connected to the data HDDs 16 through the vertical plane 19, the midplane 12 and the HDD backplanes 15, and the HDD control card 143 controls operations of the data HDDs 16. The data HDDs 16 transmit data with the motherboard module 14 through the midplane 12 and the vertical plane 19. Moreover, in this embodiment, the data HDDs 16 and the motherboard modules 14 are respectively located at two opposite sides of the fan module 13. Specifically, the fan module 13 partitions the cage 11 into a left area and a right area, the data HDDs 16 are located at the right area of the cage 11, and the motherboard modules 14 are located at the left area of the cage 11, so as to simplify the spatial configuration inside the storage server 10.

In addition, the data HDDs 16 may be disassembled from the HDD frame 18 along a third direction D3 leaving the HDD backplanes 15 (that is, leaving the bottom plate 111), so as to be detached from the cage 11, and the third direction D3 is intersected with the second direction D2 and the first direction D1. Moreover, the third direction D3 is orthogonal to the second direction D2 and the first direction D1.

Moreover, in this embodiment, the storage server 10 further comprises a power supply module 17, the power supply module 17 is detachably disposed on the bottom plate 111 of the cage 11, the power supply module 17 is located below the motherboard modules 14, and the power supply module 17 can be detached from the cage 11 along the first direction D1. In other words, the power supply module 17 and the motherboard modules 14 are all detached from the cage 11 along the first direction D1, so as to be disassembled from the cage 11. The power supply module 17 is electrically connected to the vertical plane 19 and the motherboard module 14 by electrically connecting to the midplane 12, and power of the power supply module 17 is transmitted to the motherboard module 14 through the midplane 12 and the vertical plane 19. Moreover, the power of the power supply module 17 is also transmitted to the data HDDs 16 through the midplane 12.

Moreover, in this embodiment, the storage server 10 further comprises a coupling board 151, and the HDD backplanes 15 are fixed on the coupling board 151. The coupling board 151 and the HDD backplanes 15 are detachably disposed on the bottom plate 111 of the cage 11 together, and the coupling board 151 is in contact with the bottom plate 111. The material of the coupling board 151 may be metal, and therefore, the coupling board 151 may be considered as a reinforcing plate for increasing the structural rigidity of the HDD backplanes 15.

Figure 3:
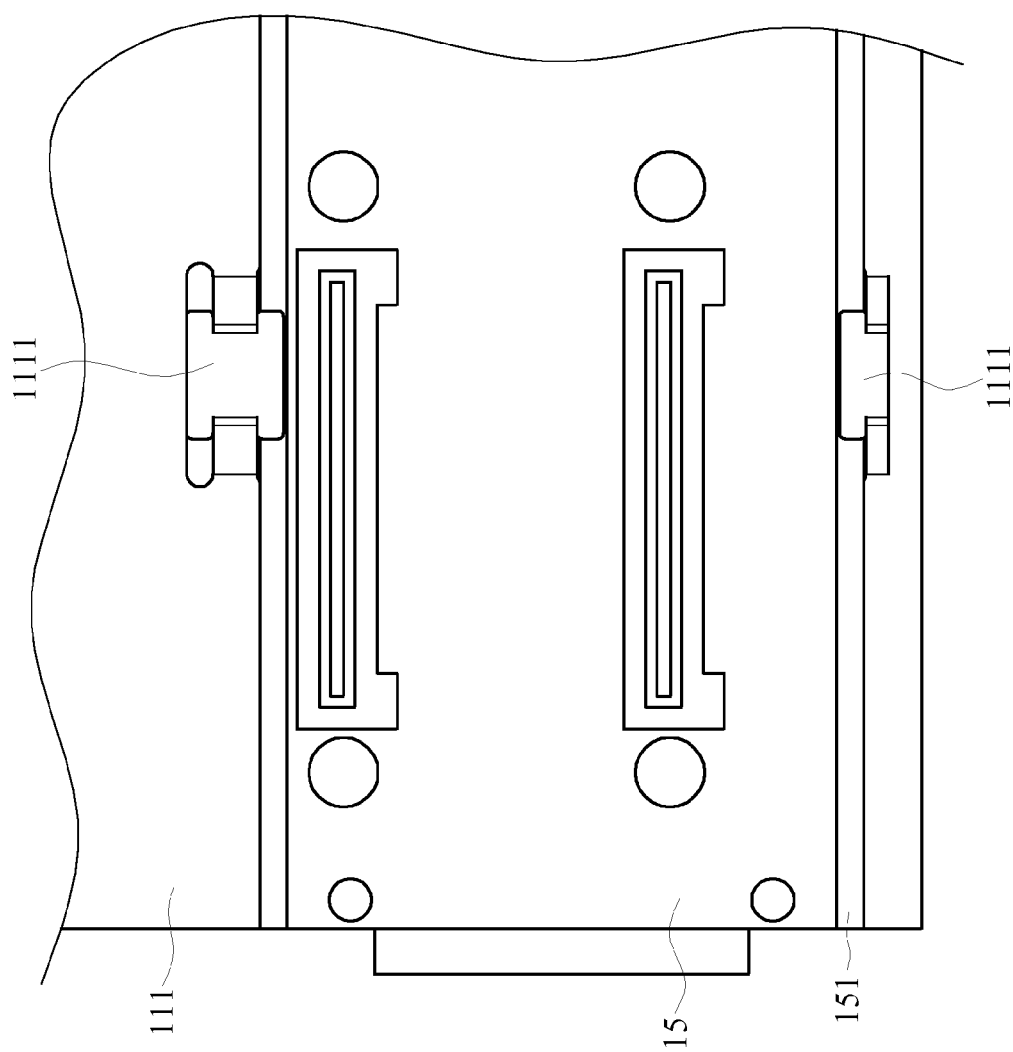
FIG. 3 is a partial top view of the storage server in FIG. 1.

Referring to FIG. 3 together with FIG. 2, FIG. 3 is a partial top view of the storage server according to FIG. 1.

In this embodiment and some embodiments, the bottom plate 111 of the cage 11 is further provided with two protruding stoppers 1111, the stoppers 1111 are protruding structures raised from the bottom plate 111. When the HDD backplanes 15 and the coupling board 151 are disposed on the bottom plate 111 together, the HDD backplanes 15 are disposed between the stoppers 1111, and the two stoppers 1111 respectively pressed against two opposite sides of the coupling board 151. In addition to providing the positioning effect when the HDD backplanes 15 and the coupling board 151 are disposed on the bottom plate 111, the stoppers 1111 may further limit displacement directions of the HDD backplanes 15 and the coupling board 151 relative to the bottom plate 111, so that the coupling board 151 and the HDD backplanes 15 can only be detached together from the cage 11 along the second direction D2.

Referring to FIG. 4 and FIG. 5 together with FIG. 2, FIG. 4 and FIG. 5 are schematic assembling views of the data HDD and the HDD frame according to FIG. 2.

In this embodiment and some embodiments, the HDD frame 18 further has a fastening hole 181, and each data HDD 16 may further comprise a body 162 and a fastening member 161 is pivotally connected to the body 162. The fastening member 161, relative to the body 162, has a releasing position erected on the body 162 (as shown in FIG. 4) and a fastening position lying flat on the body 162 (as shown in FIG. 5). When the fastening member 161 is in the releasing position, the body 162 of the data HDD 16 can be placed in the HDD frame 18 smoothly. When the body 162 of the data HDD 16 is located in the HDD frame 18 and the fastening member 161 is rotated to the fastening position, the fastening member 161 is fastened in the fastening hole 181, so that the body 162 of the data HDD 16 is fixed on the HDD frame 18.

In the storage server according to an embodiment, the host and the power supply module may be detached from the cage along the first direction, the coupling board and the HDD backplanes may be detached from the cage together along the second direction cage, the data HDDs may be detached from the cage along the third direction, and the first direction, the second direction and the third direction are different from one another. In this way, the electronic devices in the storage server can be disassembled rapidly, thereby improving the disassembly convenience of the storage server.

What is claimed is:

1. A storage server, comprising:
a cage;
a midplane, fixed on the cage;
a fan module, disposed on the cage, and located on the midplane;
at least one motherboard module, detachably disposed on the cage, and electrically connected to the midplane, the at least one motherboard module configured to be detached from the cage along a first direction leaving the midplane;
a plurality of HDD backplanes, detachably disposed on the cage, and electrically connected to the midplane, the HDD backplanes configured to be detached from the cage along a second direction leaving the midplane, and the second direction being opposite to the first direction; and
a plurality of data HDDs, divided into a plurality of groups, and detachably disposed on the cage, wherein each group of the data HDDs is respectively electrically connected to one of the HDD backplanes, the data HDDs and the at least one motherboard module are respectively located at two opposite sides of the fan module, the data HDDs are detached from the cage along a third direction leaving the HDD backplanes, and the third direction is intersected with the second direction and the first direction, wherein detachment of one of the HDD backplanes along the second direction must be preceded by detachment along the third direction of any data HDDs connected thereto.

2. The storage server according to claim 1, wherein the third direction is orthogonal to the second direction and the first direction.

3. The storage server according to claim 1, further comprising a power supply module, detachably disposed on the cage, and electrically connected to the midplane, wherein the power supply module is located below the motherboard module, and the power supply module is detached from the cage along the first direction.

4. The storage server according to claim 3, further comprising a vertical plane, erected on the midplane, the vertical plane being electrically connected to the midplane, the power supply module and the at least one motherboard module, and wherein the vertical plane is used for transmitting power of the power supply module to the motherboard module, and for transmitting the power to the data HDDs through the midplane, and wherein the data HDDs further transmit data with the motherboard module through the midplane and the vertical plane.

5. The storage server according to claim 1, wherein the at least one motherboard module further comprises a motherboard, a system HDD and a HDD control card, the system HDD is electrically connected to the motherboard, and the HDD control card is electrically connected to the data HDDs through the midplane, and controls operations of the data HDDs.

6. The storage server according to claim 1, wherein the cage further comprises a bottom plate and two side plates located on opposite sides of the bottom plate, the midplane and the HDD backplanes are disposed on the bottom plate, and the fan module, the at least one motherboard module and the data HDDs are disposed between the two side plates.

7. The storage server according to claim 6, wherein the bottom plate further comprises two stoppers protruding thereon, and one of the HDD backplanes is disposed between the two stoppers.

8. The storage server according to claim 1, further comprising a plurality of coupling boards, the HDD backplanes being fixed on the coupling boards, and the coupling boards and the HDD backplanes being detachably disposed on the cage together.

9. The storage server according to claim 1, further comprising a plurality of HDD frames fixed in the cage, and the data HDDs being disposed on the HDD frames, wherein when one of the HDD backplanes is detached from the cage along the second direction, the HDD backplane is moved relative to the HDD frames.

10. The storage server according to claim 9, wherein the HDD frames each further has a fastening hole, the data HDDs each further comprises a body and a fastening member pivoted to the body, the body of the data HDD is disposed on one of the HDD frames, and the fastening member is fastened in the fastening hole.

\* \* \* \* \*